United States Patent [19]

Bakermans

[11] Patent Number: 4,768,973
[45] Date of Patent: Sep. 6, 1988

[54] REMOVABLE RETAINING PLATE

[75] Inventor: Johannes C. W. Bakermans, Harrisburg, Pa.

[73] Assignee: AMP Incorporated, Harrisburg, Pa.

[21] Appl. No.: 69,356

[22] Filed: Jul. 2, 1987

[51] Int. Cl.⁴ ............................................. H01R 13/62
[52] U.S. Cl. ...................................... 439/331; 439/73
[58] Field of Search ..................................... 439/70–73, 439/264, 330, 331, 525, 526

[56] References Cited

U.S. PATENT DOCUMENTS

| | | | |
|---|---|---|---|
| 3,678,385 | 7/1972 | Bruner | 324/158 F |
| 3,904,262 | 9/1975 | Cutchaw | 439/331 |
| 4,018,494 | 4/1977 | Scheingold et al. | 339/17 CF |
| 4,035,046 | 7/1977 | Kloth | 339/17 CF |
| 4,063,791 | 12/1977 | Cutchaw | 439/331 |
| 4,166,665 | 9/1979 | Cutchaw | 439/331 |
| 4,278,311 | 7/1981 | Scheingold et al. | 339/17 CF |
| 4,354,720 | 10/1982 | Bakermans | 339/91 R |
| 4,376,560 | 3/1983 | Olsson et al. | 439/70 |
| 4,390,220 | 6/1983 | Benasutti | 439/331 |
| 4,494,807 | 1/1985 | Cosmo | 339/17 CF |
| 4,498,721 | 2/1985 | van Dijk | 339/75 MP |
| 4,511,197 | 4/1985 | Grabbe et al. | 339/17 CF |
| 4,513,353 | 4/1985 | Bakermans et al. | 361/339 |
| 4,547,031 | 10/1985 | Korsunsky | 339/75 M |
| 4,593,961 | 6/1986 | Cosmo | 339/61 M |

OTHER PUBLICATIONS

AMP Data Sheet 78-511 dated Feb. 1984.
AMP Data Sheet 83-732 dated Oct. 1984.
AMP Catalog 86-790 dated Oct. 1986.
AMP Technical Paper P278-85 presented Apr. 23, 1985.

Primary Examiner—J. Patrick McQuade
Attorney, Agent, or Firm—Bruce J. Wolstoncroft

[57] ABSTRACT

A retaining plate (30) is provided to insure that leads (4) secured in a protective carrier (2) are maintained in electrical engagement with conductive areas of a substrate (18). The configuration of the retaining plate (30) also insures that as the retaining plate (30) is installed onto posts (12) without exerting harmful stresses to the substrate (18). Projections (48) and openings (40) cooperate with recesses (54) and posts (12) respectively, to provide a failsafe manner to provide the contact pressure required without damaging any part of the socket (10), protective handler (2), or retaining plate (30).

7 Claims, 3 Drawing Sheets

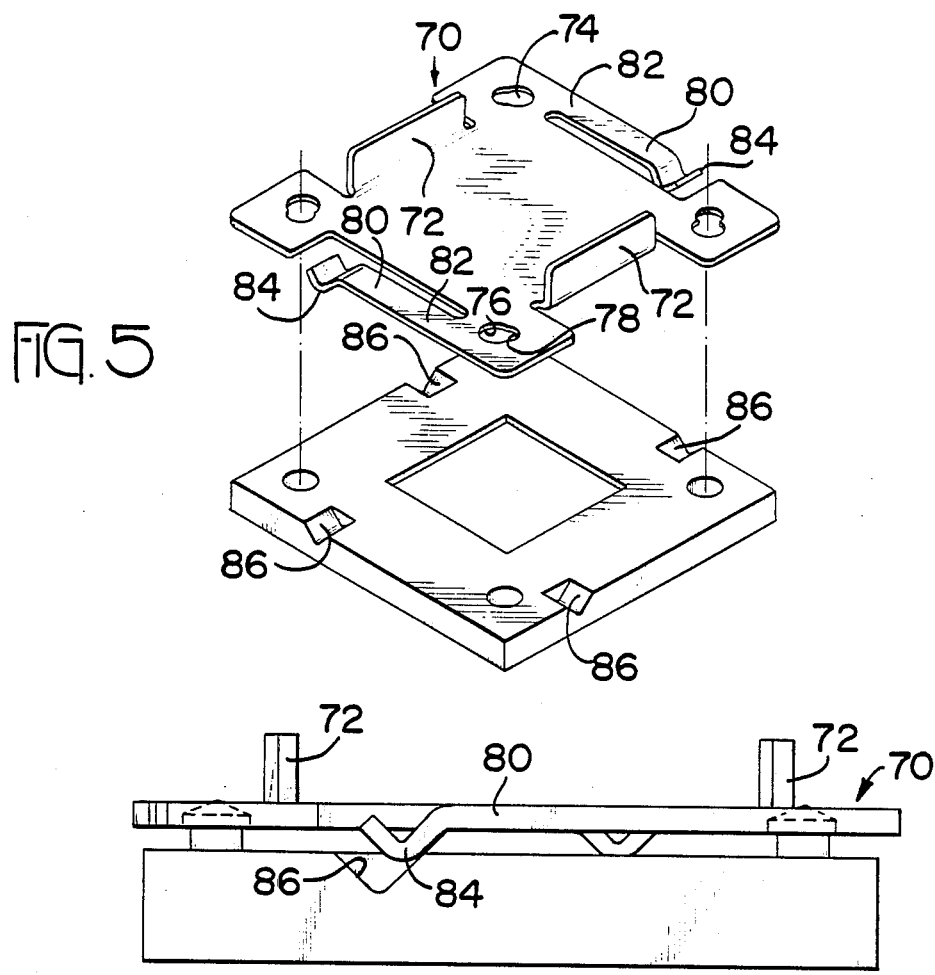

REMOVABLE RETAINING PLATE

FIELD OF THE INVENTION

The invention relates to a retaining plate which provides the force required to maintain contact areas of a chip carrier in electrical engagement with conductive areas of a substrate or the like. In particular, the invention is directed to a retaining plate which provides the proper contact pressure required to ensure a positive electrical connection between an integrated circuit and the substrate, while minimizing the insertion and removal stresses associated with the retaining plate.

BACKGROUND OF THE INVENTION

Integrated circuits (ICs) and other electronic devices are commonly packaged in so-called IC chip carriers. A chip carrier comprises a body of insulating material having the IC chip contained therein. The chip carrier has contact areas located at predetermined spaced locations near its periphery, the spaced locations correspond to the spaced locations of conductive areas of the substrate.

As technology in this area is advanced, and ICs become more complex, IC chip carriers and substrates are required to have high numbers of closely spaced contacts or conductive areas positioned thereon. With this type of technology being developed, a problem arises. It is hard to ensure that a positive electrical connection is effected between the high density, relatively small conductive areas of the substrate and the high density, relatively small contact areas of the chip carrier. Consequently, transition sockets, such as those described in U.S. Pat. No. 4,699,593, have been utilized to provide the electrical path required between the chip carrier and the substrate.

The dimensions of the chip carriers and sockets are so small that any damage to the leads of the chip carrier will result in an unstable and unreliable electrical connection. Therefore, it is important to protect the contact areas of the chip carrier during transportation and handling, to ensure that the numerous, very closely spaced contact areas are positioned in the correct locations when testing or installation is to occur. An example of the type of protective handler used is described in U.S. patent application, Ser. No. 926,024, filed Oct. 31, 1986.

The protection of the contact areas ensures that the contact areas will be maintained in their proper position. However, an unstable and unreliable electrical connection can occur due to any minimal amount of deflection or warpage associated with the chip carrier, the contact areas, or the socket. Consequently, for a positive electrical connection to be effected between the contact areas of the chip carrier and the contact areas of the substrate, it is essential that adequate contact pressure be provided to overcome and eliminate the above mentioned problems. Pending U.S. patent application, Ser. No. 926,024, filed Oct. 31, 1986 describes one type of pressure plate which provides the contact pressure required to ensure that electrical connection is affected. However, the pressure plate described and claimed in that application has several problems associated therewith.

The configuration of the pressure plate described in the above referenced referenced patent application necessitates the use of a tool for installation and removal thereof. The use of a tool complicates the procedure which must be followed when installing or removing the pressure plate. This increases the time required for installation and removal, as well as adding to the complexity of the process by requiring a separate and distinct tool for proper operation.

The use of a tool for installation is more than just an inconvenience, damage to the substrate or test site can occur, rendering the substrate effectively useless. This damage can occur as a result of the operator overstressing the posts of the substrate. As the pressure plate is inserted onto the posts of the burn-in socket, etc., the operator must turn the pressure plate by means of the screw driver or the like. This rotation enables the openings of the pressure plate to cooperate with the posts of the socket in order to apply the contact pressure required to insure that a proper electrical connection has been made between the chip and the substrate. If this is done properly, a positive electrical connection is affected and the socket, etc. is not damaged. However, in the real world, the operator is likely to rotate the pressure plate more than is required, thereby ensuring that the pressure plate is secured in place. Over rotation of the pressure plate results in harmful stresses being applied to the posts, and consequently, to the substrate. This results in damage or failure of the substrate and/or the posts. particularly over the course of many cycles. This damage can be costly to repair, as the replacement of the entire substrate may be required.

Alternatively, the operator will not rotate the pressure plate far enough, resulting in an incomplete turn of the cover plate. This under rotation of the cover plate produces an inadequate contact pressure, which in turn results in an unreliable electrical connection between the substrate and chip carrier. This can lead to inaccurate results, which may result in good quality chips being wrongly discarded. Even if the contact pressure is sufficient, the pressure plate will be easily rotated out of position as testing occurs.

As neither of the conditions described above are desirable from a cost or reliability stand point, it would be beneficial to have a contact plate which will provide a fail safe way of generating the appropriate rotation and pressure to ensure that a positive electrical connection is effected. The ideal situation being one in which the cover plate is rotated with only minimal effort from the operator, thereby eliminating the possibility of human error. The present invention is directed to the achievement of such a device.

SUMMARY OF THE INVENTION

The present invention is directed to providing the contact pressure required to ensure that the electrical connection between the leads of the integrated circuit and the contact areas of the substrate is effected. In so doing, the present invention is directed to a retaining plate which automatically provides the required contact pressure as the cover plate is inserted into position. There is no need for tools to be used, and no chance that an operator can incorrectly install the retaining plate on the socket. Therefore the chance of damage to the substrate or the possibility of an improper electrical connection due to improper contact pressure is eliminated.

The pressure plate of the present invention provides and maintains the contact force required to ensure that the leads secured in a protective carrier are maintained in electrical engagement with contacts of a socket. The socket has socket posts extending therefrom which cooperate with the retention plate.

The retention plate has a first major surface and an oppositely facing second major surface. The major surfaces being essentially parallel to one another.

Openings are provided and extend from the first major surface to the second major surface, such that the openings are in alignment with the posts of the socket. The openings are configured so that a first portion of each opening has a greater diameter than that of each post of the socket, while the second portion has a diameter less than that of each post.

Means are provided on the second major surface to rotate the retention plate as the retention plate is forced into contact with the protective carrier. In operation, the first portion of the openings of the plate is aligned with the posts of the socket. The plate is then forced toward the protective carrier to place the leads of the protective carrier in electrical engagement with the contacts of the socket. This motion of forcing the plate toward the protective carrier also causes the means for rotation to rotate the retention plate relative to the posts of the socket. This causes the second portion of the openings to engage recesses of the posts of the socket, thereby ensuring that the leads of the protective carrier are maintained in electrical engagement with the contacts of the socket.

BRIEF DESCRIPTION OF THE DRAWINGS

FIG. 5 is a perspective view of an alternative embodiment of the cover plate of the present invention.

FIG. 6 is an elevational view of the cover plate of the alternative embodiment showing the cover plate in the open position.

FIG. 7 is an elevational view similar to that of FIG. 6 showing the cover plate of the alternative embodiment in the closed position.

DETAILED DESCRIPTION OF THE INVENTION

A protective carrier 2 is provided to protect the fragile leads of a chip carrier during transportation and testing of the integrated circuit provided in the chip carrier. Retaining plate 30 cooperates with protective carrier 2 when the protective carriers is at the test site. This insures that an adequate contact force is provided to insure that a positive electrical connection is effected.

Figure 1:
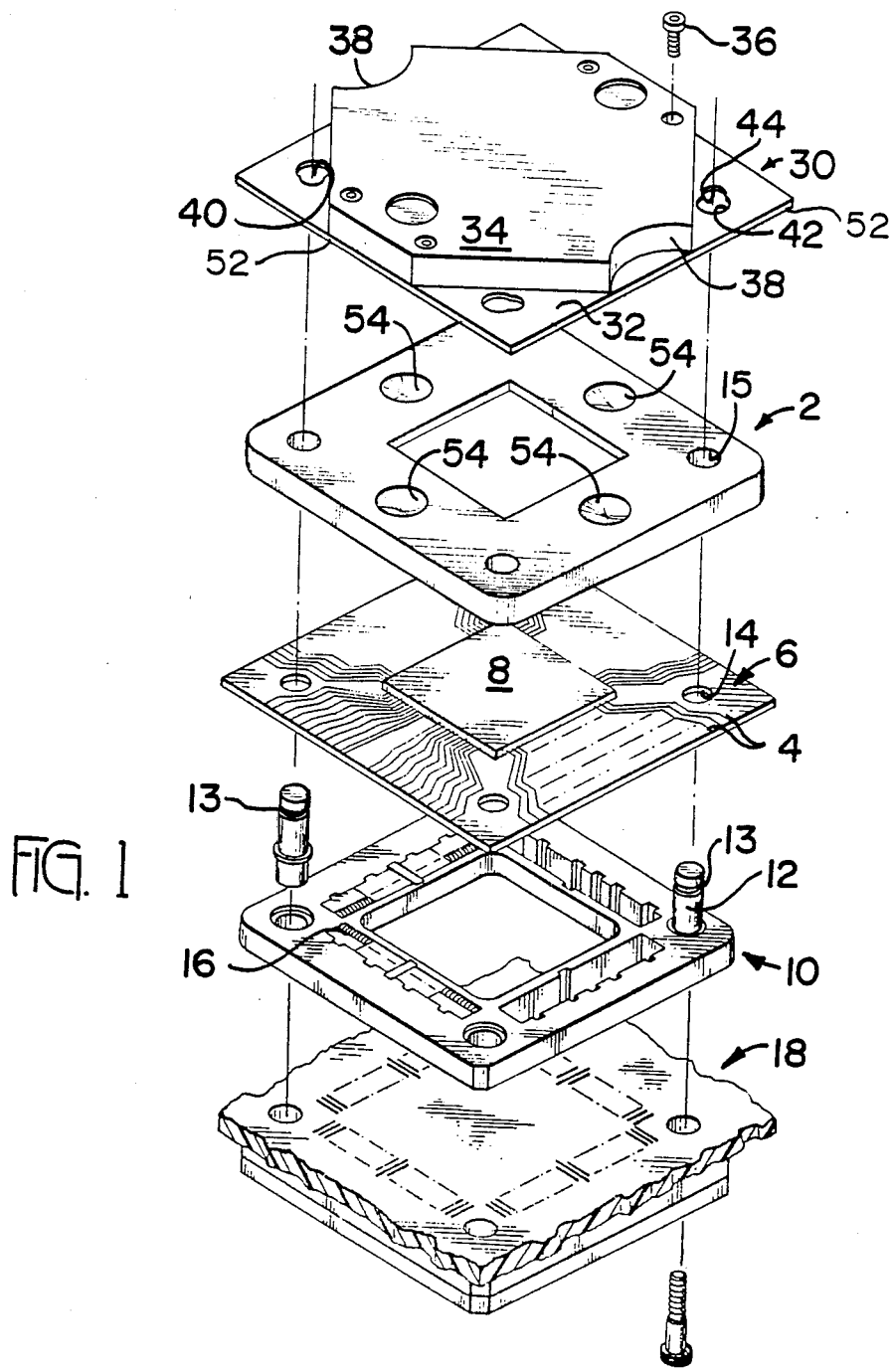
FIG. 1 is an exploded perspective view of a typical test site in which the cover plate of the present invention is used.

Referring to FIG. 1, protective chip carrier 2 is made from plastic, sheet metal, or other material having the required rigidity to protect leads 4 of flexible printed circuit 6 during shipping, testing, and operation of chip carrier 8 which contains an integrated chip therein. One type of protective carrier is described in detail in corresponding U.S. application Ser. No. 926,024, filed on Oct. 31, 1987, the entirety of which is hereby incorporated by reference.

Before the integrated circuit of chip carrier 8 can be placed in operation, testing must be performed to verify the quality of the integrated circuit. In order to accommodate integrated circuits which require many leads 4, a socket 10 is provided at the test site. One type of socket, as shown in FIG. 1, is of the type described in U.S. Pat. No. 4,699,593, which is hereby incorporated by reference.

At the test site, protective carrier 2, with printed circuit 6 provided therein, is installed on interposer socket 10. Posts 12 extend through openings 14 of circuit 6 and openings 15 of protective carrier 2. This provides proper orientation of contacts 16 of interposer socket 10 with the leads 4 of of circuit 6 such that contacts 16 are in electrical engagement with leads 4. As interposer socket 10 is already in electrical contact with substrate 18 when protective carrier 2 is properly mounted thereon, an electrical connection is formed between the integrated circuit and substrate 18.

The use of interposer socket 10 is made practical because circuit 6 will carry a large number of leads 4 in comparison to the space available. In fact, the outer portion of lead frame 4 will usually contain 320 test points. Depending on the chip carrier being used not all test points will proceed toward the center. This allows a single interposer socket 10 (with 320 contacts) to perform burn-in and testing of varying integrated circuits having any possible lead count under 320.

A problem with using protective carrier 2 or the like at a test site of the type described, or any other similar test site, is that the contact force required to electrically connect the numerous leads 4 to contacts 16 of socket 10 is significant. It is not enough to merely place protective carrier 2 on top of interposer socket 10, as not enough contact force is generated. This is particularly true when any warpage is associated with protective carrier 2, socket 10, or board 18. Also, if any permanent deflection of the contacts of socket 10 has taken place the contact force must be increased if a reliable electrical connection is to be effected. Some type of means must be provided which is capable of generating the contact force required. Consequently, retaining plate 30 is provided.

Before a detailed description of retaining plate 30 is undertaken, it is important to note that protective carrier 2 and socket 10 are merely used as examples of the type of devices with which retaining plate 30 can be used. Retaining plate 30 can be used with many types of substrates and protective carriers, in order to maintain the integrity of the electrical connection.

Retaining plate 30 is made from any material capable of withstanding the high temperatures of burn-in while maintaining its mechanical strength and integrity. This is important because if protective carrier 2 is made from plastic, retaining plate 30 must support the plastic as high temperatures are reached.

Unlike protective carrier 2, retaining plate 30 remains at the test site. The purpose of retaining plate 30 is to support protective carrier 2 and to provide and maintain the required contact force required to ensure that an electrical connection is maintained between contacts 16 and leads 4. Both of these operations are needed only at the test site and consequently, retaining plate 30 remains at the site. As retaining plate 30 is made of material which maintains its mechanical strength and integrity, retaining plate 30 can be used for many cycle before being discarded.

Retaining plate 30 is made from a square metal plate 32 onto which a molded cover plate 34 is secured by means of screws 36 or the like. Screws 36 are positioned in openings which extend through cover plate 34 and metal plate 32. This allows metal plate 32 and cover plate 34 to behave as a single piece. Arcuate surfaces 38 are provided on the sides of cover plate 34, such that the operator can easily grip cover plate 34, as will be more fully described below.

Metal plate 32 has openings 40 provided proximate each corner thereof. Each openings 40, as shown in FIG. 1, has a first arcuate section 42 and a second arcuate section 44. The first arcuate section 42 has a larger diameter than the second arcuate section 44. However, as sections 42, 44 overlap, opening 40 is provided in the shape which resemble the outline of the figure eight.

Figure 2:
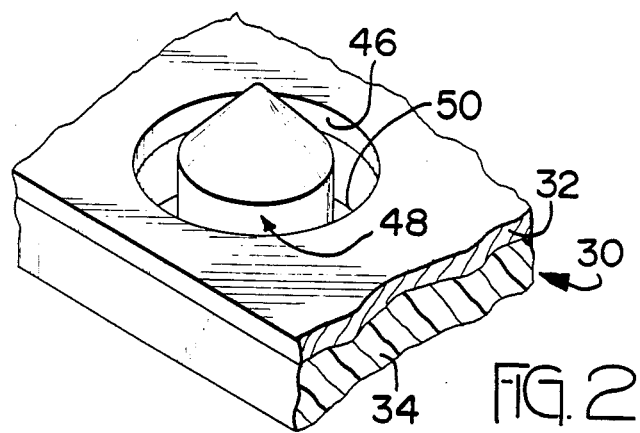
FIG. 2 is a perspective fragmentary view of camming member located on a bottom surface of the cover plate.
Figure 3:
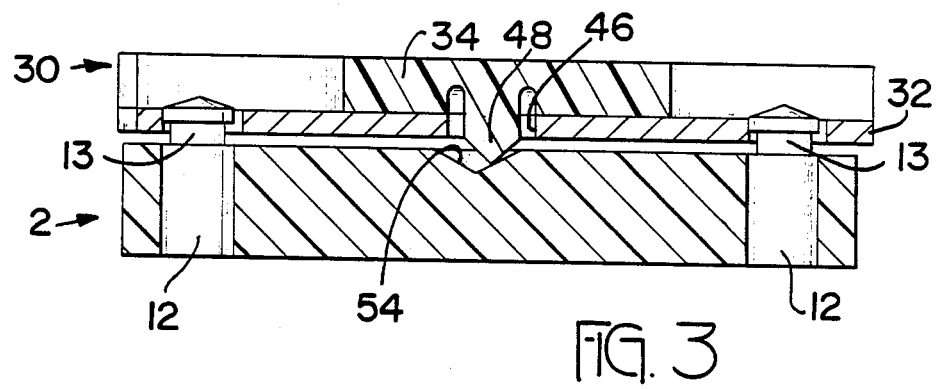
FIG. 3 is a cross sectional view showing the cover plate in the open position.
Figure 4:
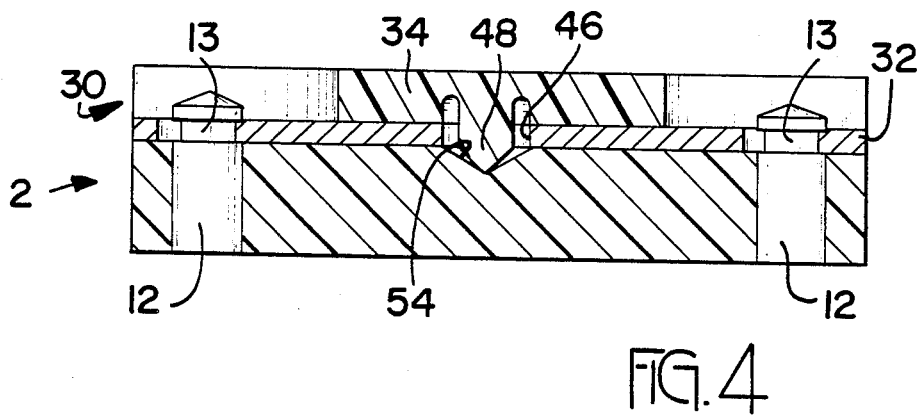
FIG. 4 is a cross sectional view similar to that of FIG. 3, showing the cover plate in the closed position.

Openings 46, as shown in FIG. 2, are provided in metal plate 32 and cooperate with projections 48. Projection 48 extend from cover plate 34 through opening 46 such that projections 48 extend beyond a bottom surface of metal plate 32, as shown in FIGS. 3 and 4. Projections 48 are generally cylindrical in shape with the end thereof tapering into a conical shape. As can be seen in FIGS. 3 and 4, projections 48 are integral with cover plate 32. A slot 50 surrounds each projection 48, such that projections 48 have the resilient characteristics required, as will be discussed.

It should be noted that openings 46 are not centered with respect to side surfaces 52 of metal plate 32. Instead openings 46 are centered with respect to the center of first arcuate sections 42. This allows projections 48 to be centered with respect to pins of socket 10 when retaining plate 30 is in the first or open position.

Protective carrier 2 has conical recesses 54 provided on a top surface thereof. The slope of the surface of recesses 54 is more gradual than the slope of the surface of the end of projections 48, as is best shown in FIG 4. This allows projections 48 to be inserted into recesses 54.

In operation, retaining plate 30 is moved from the first or open position, as shown in FIG. 3, to the second or closed position, as shown in FIG. 4. In so doing the contact pressure required for proper operation is supplied.

Retaining plate 30 is positioned over protective carrier 2 which has already been placed in position. First arcuate sections 42 of openings are inserted over pins of socket 10. This positions projection 48 as shown in FIG. 3. In this position, the point of the conical end of each projection 48 engages the side surface of a respective recess 54 of protective carrier 2. It should be noted that although only two projections 48 are provided, recesses 54 are positioned proximate each side surface of handler 2. This allows cover 30 to be placed on handler 2 with no particular orientation.

A downward force is applied to cover plate 34 of retaining plate 30, forcing retaining plate 30 to move toward protective carrier 2. This force can be applied manually or by some type of robotic equipment. The force causes the conical ends of projections 48 to move along the surfaces of recesses 54. This cooperation of surfaces causes projections 48 to rotate relative to the protective carrier 2 as the downward force is applied. As the projections 48 are integral with retaining plate 30, the rotation of projections 48 causes the retaining plate 30 to rotate accordingly.

The rotation of retaining plate 30 causes openings to rotate. Consequently, second arcuate sections 44 are brought into contact with posts 12. In particular, second arcuate sections 44 cooperate with grooves 13 provided in posts 12, such that as rotation occurs, second arcuate sections 44 engage grooves 13 of posts 12, thereby locking retaining plate 30 in place. This defines the second position as shown in FIG. 4. It should be noted that the end of conical section of projection 48 is adjacent the point of recesses 54 when this position is reached. This allows the projection 48 to be in a relatively unstressed position when the closed position is at reached, helping to prolong the useful life of projections 48 and consequently, retaining plate 30.

The cooperation of second arcuate sections 44 with grooves 13 and the position of projections 48 in recesses 54 prevents movement of retaining plate 30 in the horizontal direction. In other words, the cooperation of second arcuate sections 44 with grooves 13 provides a self locking feature. This ensures that the contact pressure supplied by retaining plate 30 will be maintained as testing occurs.

To release retaining plate 30 from posts 12, a vertical rotating or twisting force is applied to cover plate 34 of retaining plate 30. This force can be applied to arcuate surfaces 38 either manually or by robotic means. This causes the retaining means to rotate in the opposite direction of insertion. This causes the conical section of projections 48 to cooperate with surfaces of recesses 54. This movement of projections 48 along recesses 54 causes projections 48 to be forced upward in the horizontal direction. As this motion occurs, second arcuate sections are rotated away from grooves 13 of posts 12, thereby positioning first arcuate sections 42 in alignment with posts 12. This causes retaining plate 30 to be loosened, and therefore, no forces are exerted by retaining plate 30 on protective carrier 12. The retaining plate can then be removed, allowing the protective carrier to be removed and replaced with another. The operation of retaining plate 30 is then repeated.

An alternative embodiment is shown in FIGS. 5 through 7. Retaining plate 70 is made from a metal plate which has sections 72 bent up as shown in FIG. 5. Sections 72 are provided to allow the appropriate forces to be applied to retaining plate 70. Openings 74 are the same as openings described earlier. First arcuate sections 76 and second arcuate section 78 perform in the same manner as described. The function and operation of retaining plate 70 is identical to the function and operation of retaining plate 30. However, instead of projections 48, retaining plate 70 has spring arms 80. Spring arms 80 are formed from retaining plate 70 such that spring arms 80 are connected to retaining plate 70 only at 82. This allows spring arms 80 to have the resilient characteristics required for proper operation. Arcuate surfaces 84 are provided at the ends of spring arms 80, the arcuate surfaces extend beyond the bottom surface of retaining plate 70, as is shown in FIG. 5.

The operation of retaining plate 70 is very similar to the operation of retaining plate 30. Arcuate surfaces 84 cooperate with recesses 86 to rotate retaining plate 70 in the same manner as was previously described with retaining plate 30.

The various embodiments of the retention plate provide an inexpensive, extremely reliable manner of providing the contact force required to insure that a positive electrical connection is effected between the integrated circuit and the substrate. As the retention plate will be used for many cycles, the retention plate is configured such that harmful forces are not applied to the posts or the substrate during insertion and removal of the retention plate. Therefore, the retention plate described is cost effective and reliable over many cycles.

I claim:

1. A retention plate for providing and maintaining the contact force required to ensure that leads secured in a protective carrier are maintained in electrical engagement with contacts of a socket, the socket having posts extending therefrom, the retention plate comprising:

a first major surface and an oppositely facing second major surface, the first and second major surfaces being essentially parallel;

openings which extend from the first major surface to the second major surface, the openings positioned to align with the posts of the socket, the openings are configured such that a first portion of each opening has a greater diameter than that of the post of the socket, while a second portion has a diameter less than the that of the post;

means provided on the second major surface to rotate the retention plate as the retention plate is forced into contact with the protective carrier;

whereby the first portion of the openings of the plate is aligned with the posts of the socket, the plate is then forced toward the protective carrier to place the leads of the protective carrier in electrical engagement with the contacts of the socket, this motion of the plate toward the protective carrier also causes the means for rotation to rotate the retention plate relative to the posts of the socket, causing the second portion of the openings to engage recesses of the posts of the socket, thereby providing a self locking feature which ensures that the leads of the protective carrier are maintained in electrical engagement with the contacts of the socket.

2. A retention plate as recited in claim 1 wherein the means for rotation has at least one projection extending beyond the second major surface.

3. A retention plate as recited in claim 2 wherein the means for rotation has two projections extending beyond the second major surface, the projections extending from proximate opposite edges of the retention plate.

4. A retention plate as recited in claim 3 wherein the projections have conical portions at the ends thereof, the conical ends cooperating with conical recesses provided in the protective carrier such that as a force is applied to the first major surface of the retention plate, the ends of the projections cooperate with the walls of the recesses to cam the retention plate into a closed position, in which the second portions of the openings cooperate with the posts to secure the cover plate in the closed position.

5. A retention plate as recited in claim 1 wherein the means for rotation are comprised of resilient arms which are integral with the cover plate.

6. A retention plate as recited in claim 5 wherein the resilient arms have end sections which are formed, such that the end sections extend beyond the plane of the second major surface, so that the end sections can cooperate with recesses provided in the protective carrier.

7. A retention plate as recited in claim 1 wherein gripping surfaces extend from the first major surface, the gripping surfaces are provided to allow for removal of the retention plate from the socket, whereby as pressure is applied to the gripping surfaces, the retention plate is turned, thereby causing the means for rotation to disengage from recesses provided in the protective carrier, which in turn allows the second portions of the openings to disengage the posts of the socket, thereby allowing the retention plate to be removed from the socket.

* * * * *